United States Patent [19]
Luhman et al.

[11] Patent Number: 5,987,340
[45] Date of Patent: *Nov. 16, 1999

[54] SUPERCONDUCTING WINDOWS FOR ELECTROMAGNETIC SCREENING

[75] Inventors: Thomas S. Luhman, Bellevue; Michael Strasik; Darryl F. Garrigus, both of Issaquah, all of Wash.

[73] Assignee: The Boeing Company, Seattle, Wash.

[*] Notice: This patent issued on a continued prosecution application filed under 37 CFR 1.53(d), and is subject to the twenty year patent term provisions of 35 U.S.C. 154(a)(2).

[21] Appl. No.: 08/015,183

[22] Filed: Feb. 5, 1993

[51] Int. Cl.$^6$ ................................................. H01L 39/16
[52] U.S. Cl. .................... 505/182; 505/202; 505/237; 505/238; 428/312.2; 428/930
[58] Field of Search ................ 505/1, 701, 702, 505/703, 704, 202, 163, 237, 238, 776, 182; 174/35 MS; 428/596, 688, 689, 690, 210, 930, 304.4, 312.2

[56] References Cited

U.S. PATENT DOCUMENTS

| | | | |
|---|---|---|---|
| 3,603,716 | 9/1971 | Koren | 175/35 MS |
| 4,828,931 | 5/1989 | Ogawa et al. | 428/596 |
| 4,886,776 | 12/1989 | Early | 505/776 |
| 5,015,619 | 5/1991 | Wang | 505/160 |
| 5,036,042 | 7/1991 | Hed | 505/182 |
| 5,187,327 | 2/1993 | Ohta et al. | 505/1 |
| 5,587,228 | 12/1996 | Baker et al. | 428/34.5 |
| 5,589,441 | 12/1996 | Baker et al. | 505/125 |

OTHER PUBLICATIONS

"Engineers Guide to High T. Supercond.", by Doss, 1989, pp. 267–268, Wiley & Sons.
Geballe, Science, vol. 259, Mar. 12, 1993 pp. 1550–1551.
Sahu et al. "Chemistry of High Temperature Superconductors II," 1988, Chapter 1, pp. 1–15.
Noguchi et al. "Magnetic Susceptibility of Fe–Doped $YBa_2Cu_3O_{7-\delta}$", Jap. Jour. of App. Phys., vol. 27, No. 3, Mar. 1988, pp. L390–L392.
Saini et al., "Synthesis and Study of 10% NiDoped High T. Superconductor," Modern Physics Letters B vol. 4, No. 2 (1990), pp. 105–109.

Primary Examiner—Marie Yamnitzky
Attorney, Agent, or Firm—John C. Hammar

[57] ABSTRACT

A method and apparatus for temperature activated protection of electronic components from interfering electromagnetic radiation comprising the step of shielding of a component with a thin film of superconducting material characterized by a critical temperature of at least 93°K, and exposing the film to a temperature below the critical temperature. To allow transmissions to and from the component, the shield is converted to a window by heating the film to a temperature above the critical temperature.

5 Claims, 5 Drawing Sheets

SUPERCONDUCTING WINDOWS FOR ELECTROMAGNETIC SCREENING

NOTICE OF GOVERNMENT RIGHTS

This invention was made with Government Support under Contract No. F4962-88-C-0143 awarded by the United States Air Force. The Government has certain rights in this invention.

The present invention is directed to windows comprising superconducting material that selectively block or transmit incident electromagnetic radiation. Such materials are commonly called electromagnetic "windows". In particular, the present invention is directed to windows made of superconducting metal oxides for screening electronic components from externally produced interfering electromagnetic radiation.

BACKGROUND OF THE INVENTION

Screening of electronic components from electromagnetic radiation, particularly from microwave and radio frequency radiation, is particularly important for components in communications equipment, radar, microwave target acquisition devices, and the like, to prevent the electronic components from external jamming or from unwanted listening devices. One approach would be to use metallic films, or coatings. However, this approach poses the additional problem of needing to physically remove the metallic screening when it is desired to send or receive a signal. Such a removal mechanism would necessarily involve a mechanical attachment, like a shutter, thereby complicating the overall design, possibly compromising the reliability of the equipment.

It would therefore be desirable to screen electronic components from unwanted electromagnetic radiation, but yet be able to remove that screen, when desired, in a simple manner.

The recently discovered superconducting materials which are superconducting above about 93°K comprise multiple phases of metal oxides, the most important of which is $YBa_2Cu_3O_{7-x}$ (see M.K. Wu, et al. *Phy. Rev. Let.*, 58 (9), 908-910 (1987)). Typical electrical conductivity of the YBaCuO materials above their critical temperature ($T_c$) can be adjusted by doping. Typical values are $3.3 \times 10^5$ siemens/M (resistivities are around $300 \times 10^{-6}$ ohm-cm). The present invention is based in part on our recognition that thin films or layers of the superconducting metal oxide materials, at above their critical temperature, can transmit electromagnetic radiation, particularly microwave radiation, like sunlight, through clear glass, while below their critical temperature they serve as a reflector of such radiation. This discovery is particularly advantageous for use, for example, as an electromagnetic screen on a satellite in outer space, where the temperature of below about 93°K can be attained without the use of specialized refrigeration. Thus, for example, electronic components in a satellite before launch while on the ground and/or en route to its designated orbit, may be screened from electromagnetic interference by cooling the window with liquid nitrogen. Once in orbit, temperatures below $T_c$ may be achieved naturally by shading the screen or pointing it toward deep space, thereby making the film a reflecting or absorbing screen to protect the satellite's sensors from unwarranted radiation. When warmed, however, above the transition temperature, the film would be transparent to incident radiation and would allow its transmission across the film. Heating may be achieved by pointing the screen at the sun, reflecting sunlight onto it, or by other active heating means.

The present invention is further based in part on our recognition that to serve as a temperature sensitive window-screen the thickness of a superconductor film be very small, i.e. on the order of less than about 0.001 times a skin depth, where skin depth is defined by $$\delta = 1/\sqrt{\pi f \mu \sigma}$$

wherein f is frequency in cycles/sec, $\mu$ is magnetic permeability in henry/m and $\sigma$ is electrical conductivity in siemens/M.

This theory assumes that the normal temperature conductivity of the metal oxide film is below about $3.3 \times 10^5$ (S/M). Thus, for example, at a frequency of impinging radiation of 10 GHz, the skin depth of a YBaCuO superconductor in its normal state, T>93°K, is about 9 micrometers. Without considering the reflections occurring at the front and rear surfaces of the skin, the thickness of the skin should be about 1 to 2 micrometer to allow sufficient transmission of the 10 GHz signal through the skin at a temperature greater than 93°K. Including the front and rear surface reflections on the skin, to achieve significant transmission through the skin, the skin would have to be significantly thinner, i.e. on the order of about .01 micrometer or less.

It is therefore an object of the present invention to provide an electromagnetic shielding device which is temperature controlled to serve as a window or screen. Electrical components are shielded with a thin film or layer of superconductor metal oxide material of a sufficient thickness to allow electromagnetic transmission therethrough at a predetermined frequency, when the film is heated above the transition temperature of the superconductor.

This and other objects will be provided by the following description and from practice of the invention.

SUMMARY OF THE INVENTION

A method and apparatus are provided for temperature-controlled shielding of an electronic component from interfering electromagnetic radiation comprising the steps of shielding the component with a thin film or layer of superconductor material characterized by a critical temperature above about 93°K, and exposing the film to an environment wherein the temperature is below the critical temperature.

DESCRIPTION OF THE PREFERRED EMBODIMENT

Figure 1:
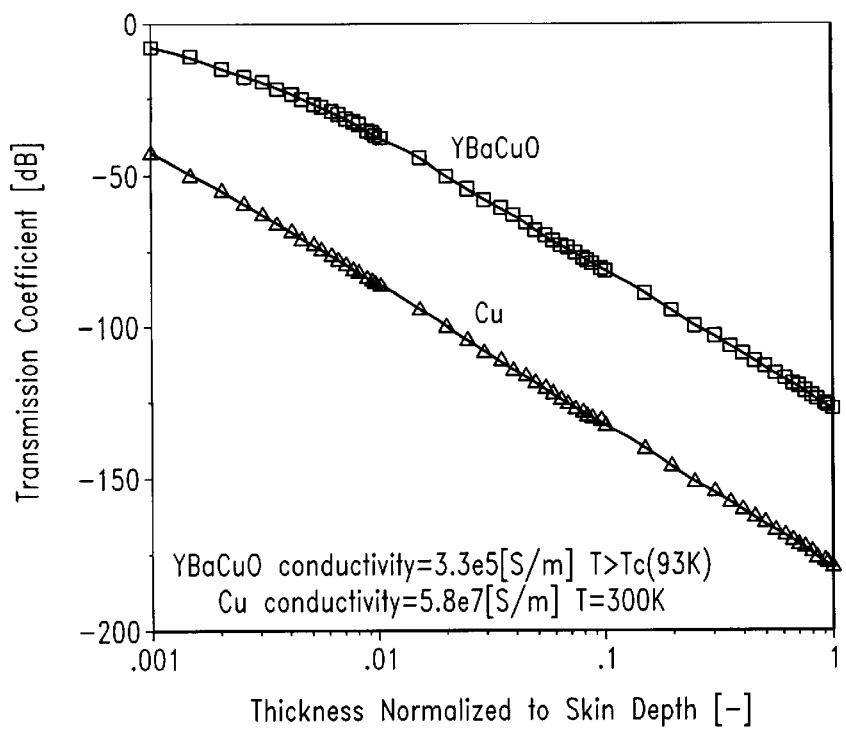
FIG. 1 is a graph of the transmission coefficient of films of YBaCuO and metallic copper at a temperature greater than 93°K as a function of film thickness normalized to skin depth.

The present invention provides a method for protection of an electronic component from interfering electromagnetic radiation. This protection is provided by a protective film or layer of a superconductor metal oxide which has a high critical temperature, typically above about 93°K, coated upon the radome or sensor face. The superconducting film can be made transparent to the incident radiation by heating. The film or layer, if based on a YBaCuO superconductor material, can be less than or equal to about 0.001 times the skin depth calculated by the formula $$\delta = 1/\sqrt{\pi f \mu \sigma}$$

wherein f, $\mu$ and $\sigma$ are defined above. This theory assumes that the normal temperature conductivity of the metal oxide material is below about $3.3 \times 10^5$ siemens/meter. The normal temperature conductivities of metal oxides may be lowered by doping with dielectric materials, such as by transition metal doping, or by phase control in which case the superconductor oxide layer may be thicker, typically thicker than 0.01 micrometer.

By exposing the protective film to a temperature above the critical temperature of the superconductor, the film will serve as a shield to electromagnetic radiation of a selected frequency range.

The types of superconductor oxide which may be conveniently used in accordance with the present invention include those normally called mixed metal oxides or ceramic (so called 1-2-3) superconductors of which the representative one is $YBa_2Cu_3O_{7-x}$, the accepted formula recognized in the art for a class of metal oxide superconductors. Methods of forming thin films of these mixed metal oxide superconductors are known in the art. For example, they may be made by sputtering stoichiometric amounts of the metals (or metal oxides) onto a substrate using a heat source such as a laser, electron beam, and the like. In the usual instance the deposited film is cured in an oxygen atmosphere to obtain the required oxygen content for the stoichiometry leading to superconductivity. In this manner thin films from a few Angstroms to several hundred Angstroms in thickness may be deposited. This film thickness is the expected range whereby the metal oxide will have a thickness corresponding to about 0.001 or less times the skin depth as calculated above.

Since reflectivity of electromagnetic radiation on a conducting surface generally increases with the conductivity of the material of which the surface is made, and since at temperatures above the critical temperature the superconductor material is in a (normal) non-superconducting state, transmission may be increased during that state by decreasing the conductivity by doping. Such doping may be done, for example, by depositing the superconducting metal oxide with dopants such as transition metals, or by phase controlling. Doping may be accomplished with transition metals by adding the transition metal to the mixture of copper, barium and lanthanide metals used, for example, for sputtering. Transition metals include those of the first transition series, Ti through Cu; the second transition series Zr through Ag; the third transition series, Hf through Au; as well as other metallic elements, such as those of Groups IA, IIA, IIIA, IVA, VA, VIA and IIB.

While the superconductor is in a superconducting state the skin depth is so shallow at 10 GHz and since the electric field vector attenuates as an inverse function of "e", the natural logarithm base, at one skin depth the E-field value is 0.368 of the value at the front surface. By convention, 5 skin depths is the thickness whereby the signal is considered to have gone to zero (actually $\cong 0.007$ of the front surface E-field value). This would imply that while in the superconducting state a perfectly laid-down film of superconductor would theoretically only have to be on the order of $1.5 \times 10^{-12}$m thick, to block virtually all electromagnetic radiation at 10 GHz. The atomic diameter of a copper atom is 2.551 Å or which makes it impossible to have a layer $1.5 \times 10^{-12}$m thick.

By making the room temperature conductivity low enough, and/or choosing a low enough frequency (f and $\sigma$ are adjustable), a thick substrate of superconductor may be used having sufficient heat dissipation capabilities while in the superconducting state to remain a screen while being a window, above the transition temperature of the film, to the low frequency radiation.

Wrinkling the planes of copper and oxygen (YBaCuO superconductors, for instance), by phase adjusting or doping, provide mechanisms whereby conductivity can be lowered in a controlled fashion. Dropping the temperature to below the transition point irons out the wrinkles (or corrugations) allowing free passageway for electron flow. The following table shows the calculated attenuation of a 100 volt per meter (field strength) traveling E-field as it passes through 5 $\mu$m thicknesses of materials of various conductivities and shows that transmission is a strong function of decreasing conductivity. The frequency chosen is 200 MHz. The attenuation is in decibels.

|  | Silver | Copper | YBaCuO |  | Graphite |
|---|---|---|---|---|---|
| Front Surface E-field strength | 100 v/m | 100 v/m | 100 v/m | 100 v/m | 100 v/m |
| Thickness in Microns | 5 $\mu$m | 5 $\mu$m | 5 $\mu$m | 5 $\mu$m | 5 $\mu$m |
| Conductivity Siemens/meter | $61.7 \times 10^6$ S/m | $58 \times 10^6$ S/m | $3.3 \times 10^5$ S/m | $1.1 \times 10^3$ S/m | 0.12 S/m |
| Back Surface E field in volts/meters | $1.78 \times 10-3$ v/m | $1.90 \times 10-3$ v/m | $6.77 \times 10-2$ v/m | 1.26 v/m | $7.88 \times 10$ v/m |
| Attenuation in Decibelstz,1/39 | −95 dB | −94 dB | −63 dB | −38 dB | −2.1 dB |
|  | (0.0018% gets through | → | decreasing through shielding |  | (78.5% gets |

The calculations describing the electromagnetic attenuation are as follows for an infinite conductive sheet of thickness t impinged upon by a normally incident wave:

$$T_v = \frac{tran \cdot e^{-r_t t}}{1 - ref \cdot e^{-2r_t t}}$$

where $$tran = \frac{4n_o \cdot n_t}{(n_o + n_t)^2}$$

$$ref = \frac{(n_o - n_t)^2}{(n_o + n_t)^2}$$

$$r_t = (1+2) \cdot \frac{\sqrt{\omega \mu \sigma}}{2}$$

$$n_t = (1+2) \cdot \frac{\sqrt{\omega \mu}}{2\sigma}$$

$$n_o = \frac{\sqrt{\mu_o}}{\epsilon_o}$$

where:
$T_v$=voltage transmission coefficient
tran=transmission factor for material
ref=reflection factor for material
$r_t$=propagation constant within material
t=thickness
$n_t$=electromagnetic impedance in material
$n_o$=impedance of free space
$\mu_o$=permeability of free space (1.257×10-6 H/m)
ehd o =permittivity of free space (8.854 ×10-12 F/m)
$\omega$=angular frequency
$\mu$=permeability of material (References: Fields and Waves in Communication (1) Electronics—Ramo, Winnery and Van Duzer (John Wiley & Son, Inc., 2nd Ed.); (2) Exact Formulas for the Microwave Shielding Effectiveness of EC-Coated Optical Windows—Claude A. Klein (Ray/RD/T—1184 Sept. 30, 1989)).

In a preferred embodiment of the present invention, a superconductor film will be utilized to protect electronic components in a satellite. In the upper regions or outside of the earth's atmosphere, temperatures of less than 93 °K are environmentally attainable without refrigeration, which thereby converts the protective coating to a superconductor shutter to electromagnetic radiation.

In an alternative embodiment of the present invention, an active cooling method may be utilized to cool the superconductor film. By deposition of the superconductor film on a fiberform or microballoon substrate, such as that disclosed in our copending application Ser. No. 07/381,498 filed Jul. 18, 1989, (now abandoned, but related to U.S. Pat. No. 5,589,441) incorporated herein by reference, liquid nitrogen or other cryogen is conducted through the fiberform or microballoon substrate to the surface of the superconductor to cool to the superconducting state.

Referring to FIG. 1 there is shown a graph of the transmission coefficients of $YBa_2Cu_3O_7$ and copper films as a function of the film thickness normalized to skin depth, $\delta$. It can be seen that for extremely thin films, i.e., about the thickness of 0.001 times the skin depth, the transmission coefficient for $YBa_2Cu_3O_7$, although above that of a metallic copper film, is still very low, thereby indicating that if the temperature is less than 93°K (i.e., below $T_c$ of $YBa_2Cu_3O$), the $YBa_2Cu_3O_7$ will serve as a good electromagnetic shield.

Figure 2:
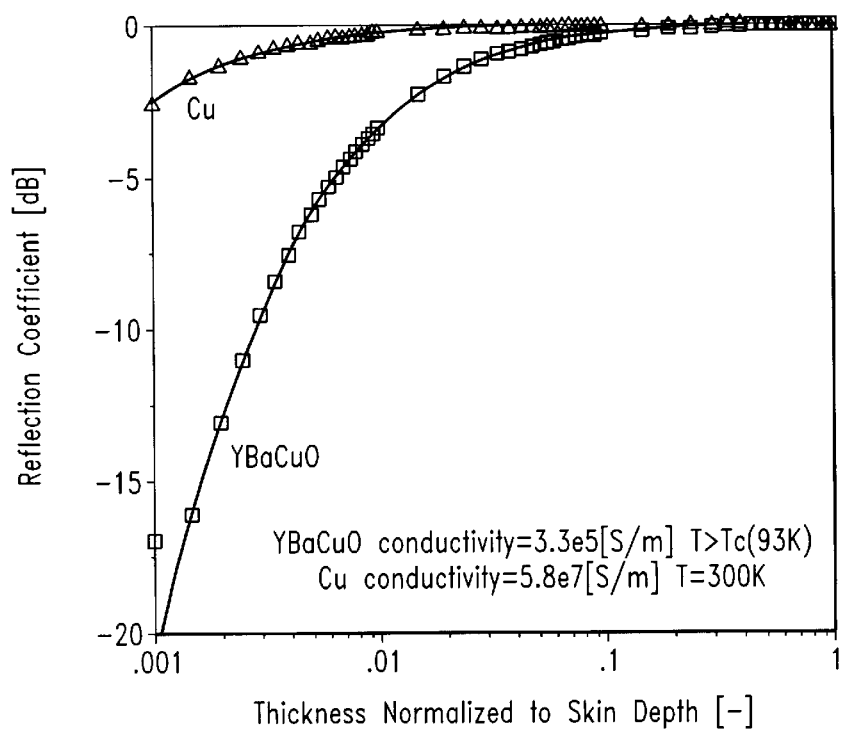
FIG. 2 is a graph of the reflection coefficient of films of YBaCuO and metallic copper at a temperature greater than 93°K as a function of film thickness normalized to skin depth.

Similarly, referring to FIG. 2, at temperatures greater than $T_c$ (93°K), and at film thicknesses at around 0.001 skin depth, the reflection coefficient of $YBa_2Cu_3O_7$ is much lower than that of copper. This fact is a further indication that $YBa_2Cu_3O_7$ at temperatures greater than $T_c$ will serve as a good window to electromagnetic radiation. The conductivity of the uncooled window (and its thickness) determine the frequency range to which it is transparent.

Figure 3:
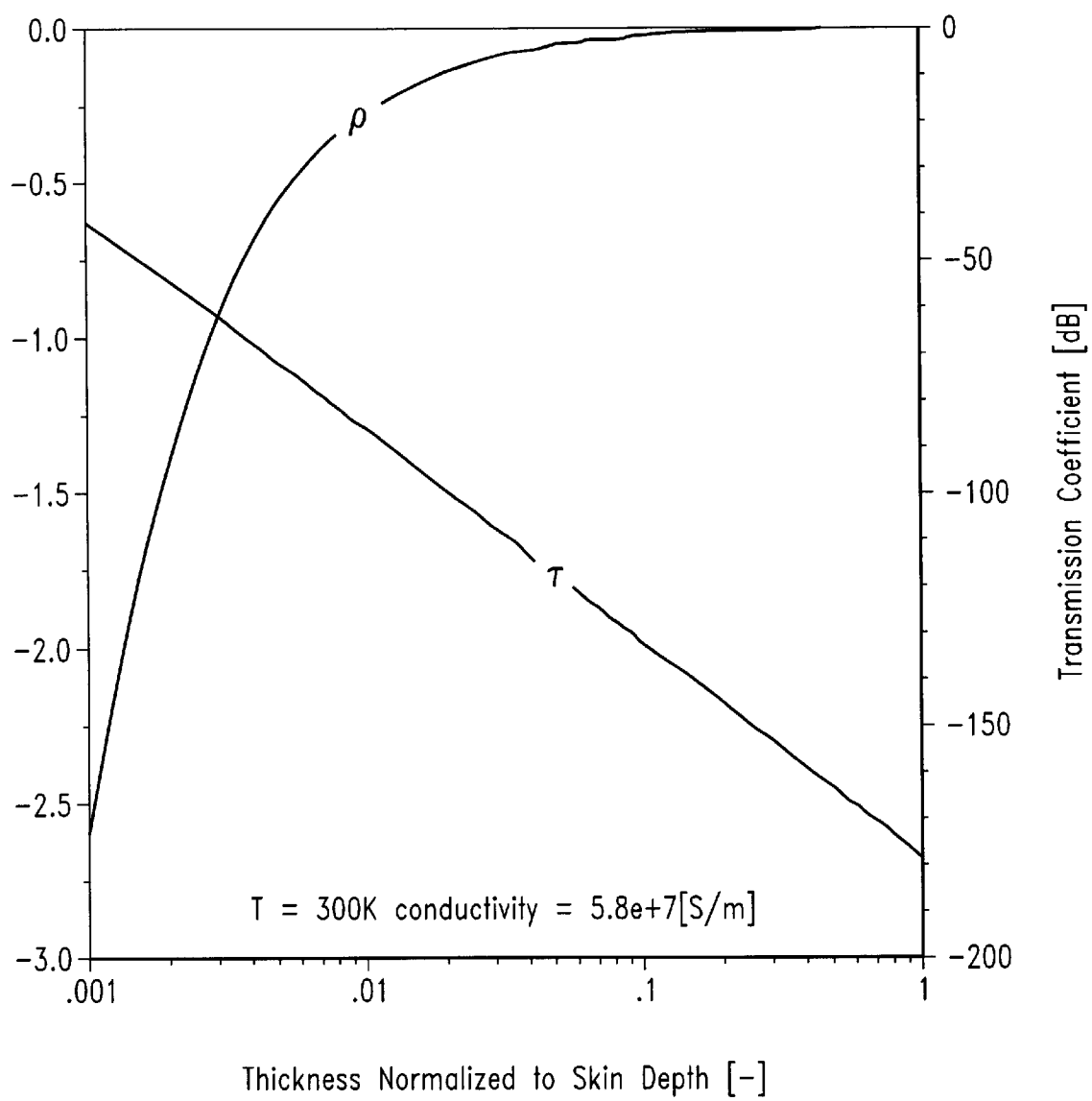
FIG. 3 is a graph of the reflection and transmission coefficients versus film thickness for a copper layer utilizing the data from FIGS. 1 and 2.
Figure 4:
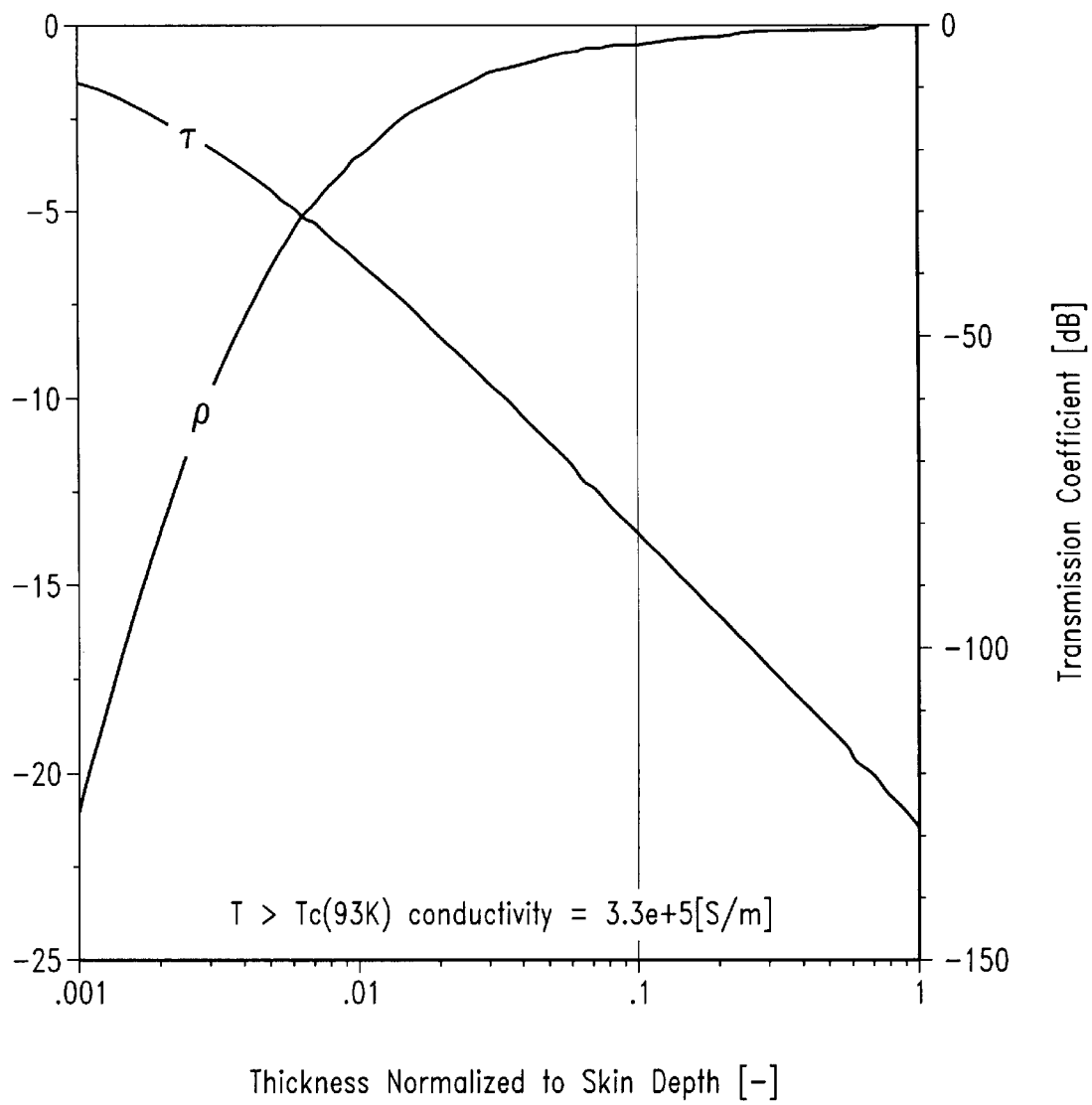
FIG. 4 is a graph of reflection and transmission coefficients versus film thickness of a YBaCuO layer using the data from FIGS. 1 and 2.

Referring to FIG. 3, there are shown reflection and transmission coefficients of a metallic copper thin film. FIG. 4 shows the reflection and transmission coefficients of a $YBa_2Cu_3O_7$ thin film. In comparing FIG. 3 to FIG. 4 it can be seen that the $YBa_2Cu_3O_7$ layer is a poor reflector of electromagnetic radiation at a skin depth of around 0.001.

Figure 5:
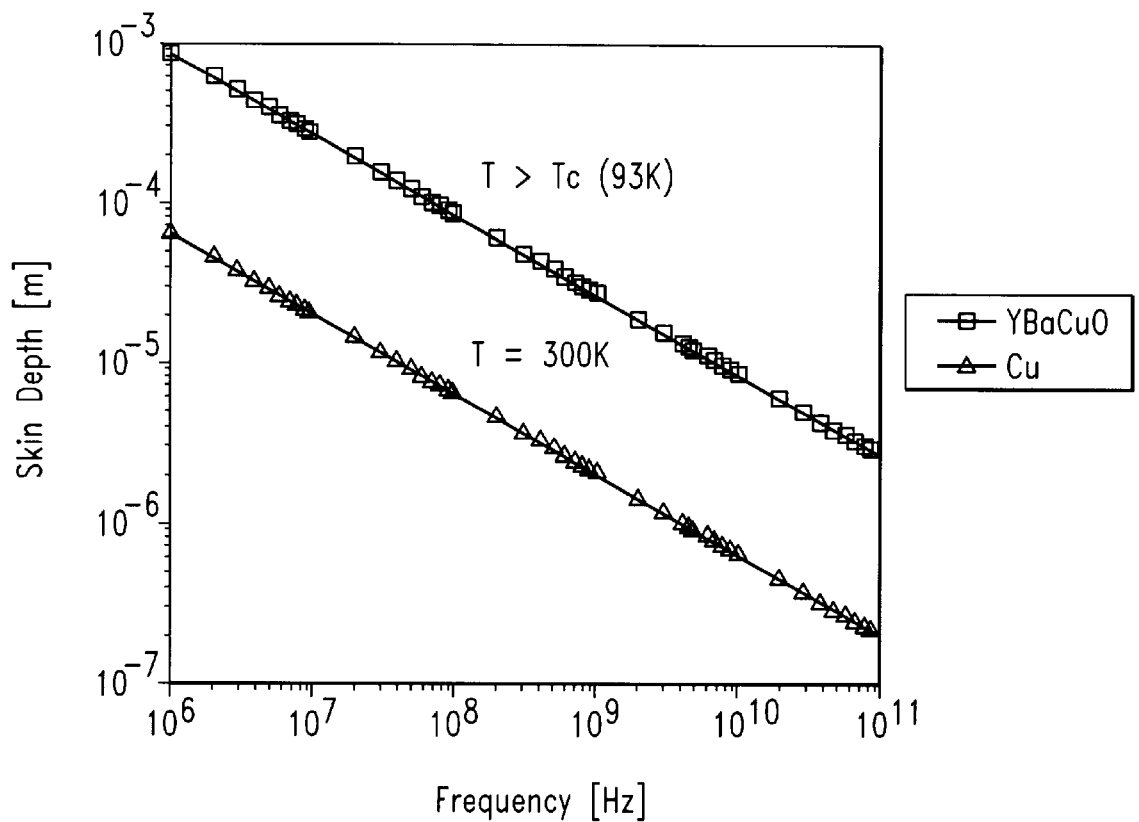
FIG. 5 is a graph of the calculated skin depth in micrometers of a YBaCuO film required to reflect electromagnetic radiation of a frequency from $10^6$ to $10^{11}$ Hz where the film is at a temperature greater than 93°K.

Referring to FIG. 5, there is shown a plot of the calculated skin depth of $YBa_2Cu_3O_7$ and Cu thin films as a function of frequency. The skin depth is much deeper than that of copper because of the lower conductivity of $YBa_2Cu_3O$ materials.

Figure 6:
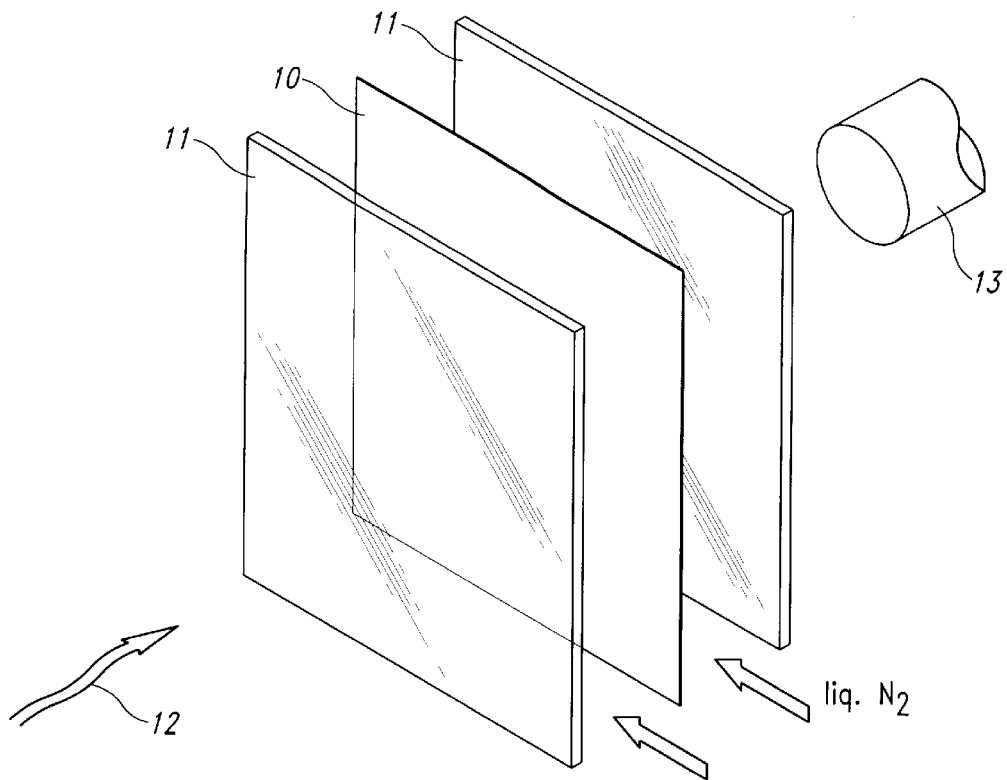
FIG. 6 is a partial exploded view of an electromagnetic radiation window in accordance with the present invention.

Referring to FIG. 6, there is shown a configuration of a shield according to the present invention. The superconductor layer 10 will be placed between two windows 11 made of, for example, glass, sapphire or other electrical nonconductor transparent to the radiation. In the spaces formed between the film 10 and each window 11, liquid nitrogen may be flushed to contact both surfaces of the superconductive film 10. The film 10 will serve as a shield between electromagnetic radiation 12 and the interior electronics or optics 13 in the vehicle.

Figure 7:
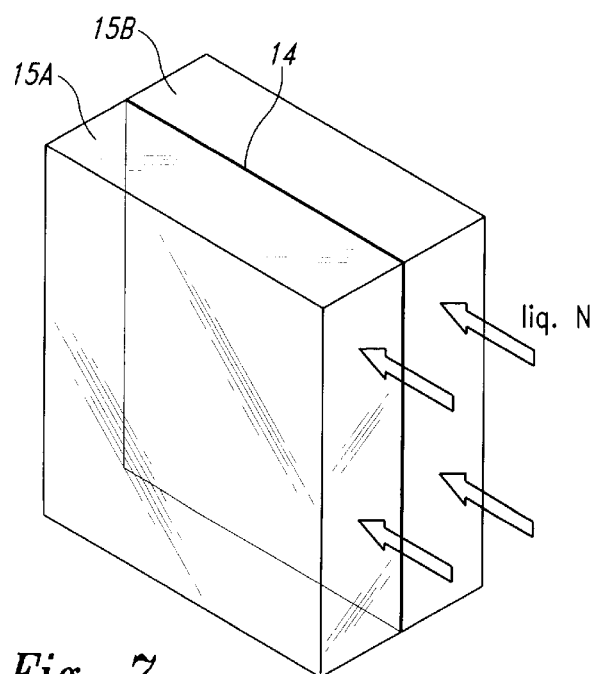
FIG. 7 is another configuration of an electromagnetic radiation shield in accordance with the present invention.

Referring to FIG. 7, a superconductor film 14 may also be sandwiched between two porous pieces 15a and 15b, such as those materials disclosed in U. S. Pat. No. 5,589,441. Ceramic materials that we call 'microform' are made by forming a mat from a slurry containing ceramic particles, particularly as fibers. The mat is strengthened with infusion of a sol-gel precursor that gels and cures. These microform materials serve as solid sponges for the liquid nitrogen. This configuration allows for lower masses of liquid nitrogen to be utilized to cool the superconductor.

The foregoing description of the preferred embodiments of the invention are presented for purposes of illustration and description. It is not intended to be exhaustive nor to limit the invention to the precise form disclosed, and obviously many modifications and variations are possible in light of the above teachings. The embodiments were chosen for description only to best explain the principles of the invention and its practical application, thereby enabling others skilled in the art to best utilize the invention and various embodiments, and with various modifications, as are suited to the particular uses contemplated. It is intended that the scope of the invention be defined by the claims appended hereto.

What is claimed is:

1. A combined thin film electromagnetic window and shield for selectively reflecting incident electromagnetic radiation in a first mode or transmitting the incident radiation through the film in a second mode, comprising:

a substrate for supporting the window and shield positioned in a transmission path for the radiation in front of electronics or optics, the substrate being transparent to the radiation and being a porous ceramic adapted for transporting liquid nitrogen to cool the film at selected intervals;

a thin film of yttrium barium copper oxide superconducting material sandwiched within the substrate, the film being characterized by a critical temperature of at least 93°K so that the film is superconducting in the first mode below the critical temperature and is not superconducting in the second mode above the critical temperature, the film having a thickness in meters no greater than about 0.001 of the skin depth calculated according to the formula $(\pi f \mu \sigma)^{-\frac{1}{2}}$, wherein f is the frequency of the radiation $\mu$ is the magnetic permeability of the film; $\sigma$ is the electrical conductivity of the film: and $\pi$ is the constant pi (i.e., the quotient of the circumference of a circle divided by its diameter) so that the film is sufficiently thin to transmit the incident electromagnetic radiation to the electronics or optics when the film is above the critical temperature; and cooling means associated with the porous ceramic of the substrate for cooling the film at selected intervals below the critical temperature to make the film superconducting and reflective, the cooling means including liquid nitrogen as a cooling fluid.

2. The window and shield of claim 1 wherein the porous ceramic is a mat made from fibers, particles, or a combination thereof; wherein cooling fluid associated with the cooling means reaches the film through the ceramic mat.

3. The window and shield of claim 1 wherein the conductivity of the film is lowered by adding sufficient doping to the film or by wrinkling the planes of constituent atoms in the film.

4. The window and shield of claim 3 wherein the ceramic is a mat made from fibers, particles, or a combination thereof.

5. A method for selectively protecting a device from incident electromagnetic radiation comprising the step of:
 (a) imposing the window and shield of claim 1 in the path of incident electromagnetic radiation, and
 (b) heating the film above the critical temperature to allow transmission of the incident radiation through the film and substrate to electronics or optics positioned in a transmission path behind the window.

\* \* \* \* \*